(12) United States Patent
Jhooti et al.

(10) Patent No.: US 7,039,451 B1
(45) Date of Patent: May 2, 2006

(54) PHASE ORDERING WITH AUTOMATIC WINDOW SELECTION (PAWS) FOR MOTION RESISTANT MRI

(75) Inventors: Permjit Jhooti, London (GB); Peter David Gatehouse, London (GB); Jennifer Keegan, Beckenham (GB); David Nigel Firman, Surrey (GB)

(73) Assignee: Imperial College Innovations Limited, London (GB)

( * ) Notice: Subject to any disclaimer, the term of this patent is extended or adjusted under 35 U.S.C. 154(b) by 477 days.

(21) Appl. No.: 10/049,899

(22) PCT Filed: Aug. 18, 2000

(86) PCT No.: PCT/GB00/03239

§ 371 (c)(1),
(2), (4) Date: Jul. 22, 2002

(87) PCT Pub. No.: WO01/14901

PCT Pub. Date: Mar. 1, 2001

(30) Foreign Application Priority Data

Aug. 20, 1999 (GB) .................................... 9919821

(51) Int. Cl.
*A61B 5/05* (2006.01)
*G01V 3/00* (2006.01)

(52) U.S. Cl. ....................................... 600/413; 324/307
(58) Field of Classification Search ................ 600/413, 600/410, 411, 412, 419, 428; 324/307, 308, 324/309, 310, 311, 315
See application file for complete search history.

(56) References Cited

U.S. PATENT DOCUMENTS

| 4,663,591 | A | * | 5/1987 | Pelc et al. ................... 324/309 |
| 4,720,678 | A | * | 1/1988 | Glover et al. ................ 324/309 |
| 4,930,508 | A | * | 6/1990 | Shimoni et al. ............ 600/410 |

(Continued)

OTHER PUBLICATIONS

Sinkus R et al; "Motion Pattern Adapted Real-Time Respiratory Gating"; Magnetic Resonance in Medicine, US, Academic Press, DULUTH, MN., vol. 41, No. 1, 1999, pp. 148-155, XP000799744.

(Continued)

*Primary Examiner*—Daniel Robinson
(74) *Attorney, Agent, or Firm*—Nixon & Vanderhye P.C.

(57) ABSTRACT

A magnetic imaging technique which is resistant to changes in breathing while allowing the use of phase ordering to provide effective motion artifact reduction in an optimal time. This is provided by apparatus for magnetic resonance imaging a target object subject to periodic motion, comprising a magnetic resonance imaging scanner for exciting said target object and recovering imaging data in k-space; a sensor for detecting a signal indicative of a position of said target object; classifying logic for classifying said at least one line of imaging data into one of a plurality of groups of lines of imaging date in dependence upon said position detected by said sensor as said target object was excited, each group of lines corresponding to one of a plurality of contiguous ranges of position and scan terminating logic for detecting when two or more groups of lines corresponding to contiguous ranges of position together containing a set of lines of imaging date spanning k-space from which an image can be derived.

11 Claims, 9 Drawing Sheets

U.S. PATENT DOCUMENTS 5,035,244 A * 7/1991 Stokar .................... 600/410
5,427,101 A * 6/1995 Sachs et al. ............... 600/410
5,842,989 A * 12/1998 Zur ........................ 600/410
6,044,290 A * 3/2000 Vigen et al. ............... 600/419
6,353,752 B1 * 3/2002 Madore et al. ............. 600/410

OTHER PUBLICATIONS

P. Jhooti et al; "3D Coronary Artery Imaging with Phase Reordering for Improved Scan Efficiency"; Magnetic Resonance in Medicine; vol. 41, 1999, pp. 555-562, XP002149700.

Weiger M et al.; "Motion-Adapted Gating Based on K-Space Weighting for Reduction of Respiratory Motion Artifacts"; Magnetic Resonance in Medicine, US, Academic Press, DULUTH, MN,. vol. 38, No. 2, Aug. 1, 1997, pp. 322-333, XP000695508.

* cited by examiner

PHASE ORDERING WITH AUTOMATIC WINDOW SELECTION (PAWS) FOR MOTION RESISTANT MRI

This application is the US national phase of international application PCT/GB00/03239 filed 18 Aug. 2000, which designated the US.

This invention relates to the field of magnetic resonance imaging. More particularly, this invention relates to techniques for increasing motion resistance in magnetic resonance imaging.

The development of navigator echo techniques has enabled the implementation of several algorithms to reduce motion effects from an image during acquisition (see references 1–11). Early gating techniques, based on the acceptance/rejection algorithm (see reference 2), were hindered by the loss in scan efficiency which resulted from the narrow acceptance windows required to effectively reduce artefacts and the variability of subjects respiration. The use of phase encode ordering (see references 8, 9) and weighting (see references 10, 11) have been shown to improve the image quality over conventional methods. The combination of phase ordering with a navigator acceptance window allowed larger acceptance windows to be used without compromising image quality whilst improving scan efficiency (see reference 9). Unfortunately, the effectiveness of all navigator acceptance window techniques is dependent on the choice of the acceptance window. Thus, during the scan, a change in the respiratory pattern may cause a window previously accepting data around the end-expiration position to be out of the new respiratory range. To overcome this limitation, more sophisticated gating techniques such as the Diminishing Variance Algorithm (DVA) have been suggested which adaptively select the most appropriate acceptance window depending on several factors such as the subjects' respiratory pattern, image data acquired so far, and scan time (see reference 4). The combination of DVA with a phase ordering or a weighting approach, although ideal, is not suited to changes in breathing patterns. The decision-taking is based upon a compromise between the repeated acquisition of profiles within an acceptable measuring time and termination of the scan because the achieved image quality is already close to the desired one (see reference 11). Although these techniques attempt to be more adaptable to changes in respiratory patterns the use of an acceptance window is inherent as a decision to accept or reject data must still be made. This is therefore prohibitive if the breathing pattern changes significantly during the acquisition as respiratory positions which were previously discarded are now desired and the previous rejection has resulted in a loss of scan efficiency. Although data can be acquired when the respiratory position is out of the required range, in case the diaphragm position changes during the scan, it is unpredictable how much will be useful when the acceptance window is moved. The use of a weighted acceptance window further complicates this.

The purpose of this invention is to seek to provide a technique which is resistant to changes in breathing whilst allowing the use of phase ordering to provide effective motion artefact reduction in a short time. Each position is regarded as equally relevant to the final image. The operator simply decides on the size of the acceptance window.

Viewed from one aspect the invention provides apparatus for magnetic resonance imaging a target object, said apparatus comprising:

a magnetic resonance imaging scanner for exciting said target object and recovering at least one line of imaging data in k-space;

a first sensor for detecting a signal indicative of a position of said target object relative to said magnetic resonance imaging scanner;

classifying logic for classifying said at least one line of imaging data into one of a plurality of groups of lines of imaging data in dependence upon said position detected by said second sensor as said target object was excited, each group of lines corresponding to one of a plurality of contiguous ranges of position relative to said magnetic resonance imaging scanner; and scan terminating logic for detecting when two or more groups of lines corresponding to contiguous ranges of position together containing a set of lines of imaging data spanning k-space from which an image can be derived and terminating data acquisition.

It will be appreciated that the first sensor may be an ECG sensor and the second sensor may be an MR sensor detecting diaphragm position.

Various other features and aspects of the invention are set out in the appended claims.

Embodiments of the invention will now be described, by way of example only, with reference to the accompanying drawings in which:

FIG. 1 shows how each index position is allotted a starting position in k-space, denoted by the solid circle. K-space is filled according to the direction of the arrows. The data acquisition scheme in the centre of k-space is more complex. In this example, for diaphragm position 4, the next phase encode line to the right of k-space would be chosen as window 4-5-6 is the closest to completion and there are more phase encode lines left to acquire between diaphragm positions 4 and 6.

Figure 5:
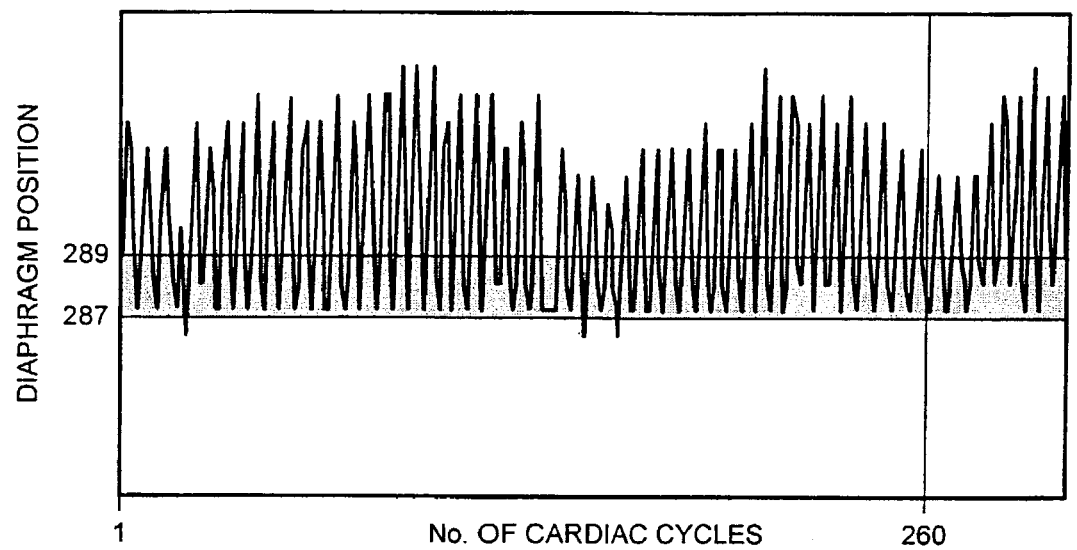
Figure 5:
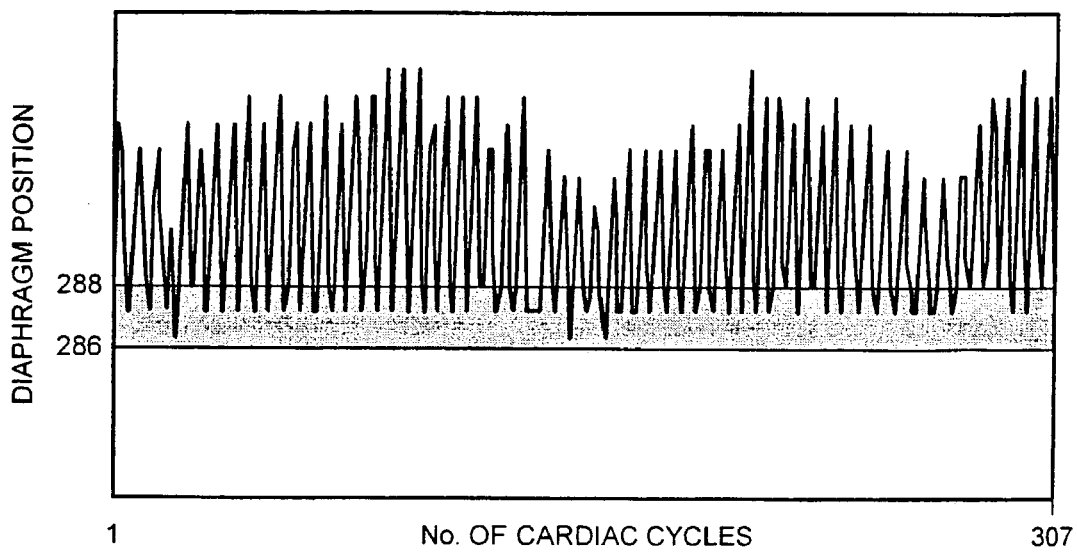

FIG. 5 shows how the PAWS technique is more efficient than the DVA technique in this typical example. Notice the different windows each method uses. The DVA technique has included the extreme and expiration position whilst the PAWS technique has discarded this position and shifted the acceptance window by 1 mm to allow a more efficient scan time.

Figure 6:
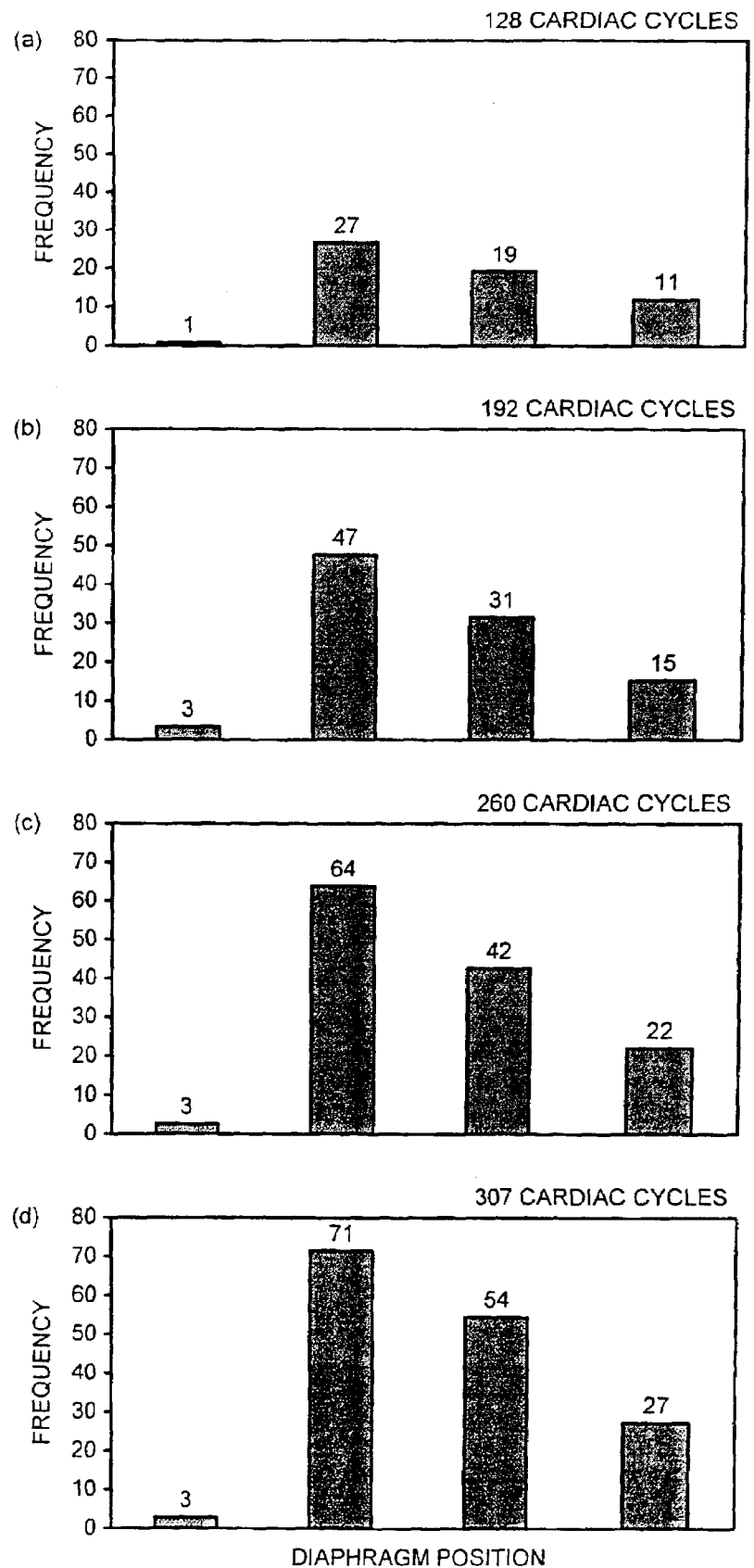

FIG. 6 shows how after 128 cardiac cycles, the most frequent diaphragm position is 287. The DVA technique aims to narrow the range of motion around this position. The optimum scan time in this example is 260 cardiac cycles as it is only at this point that 128 diaphragm positions have been recorded within a 3 mm window. The PAWS technique therefore terminates and the window is set to the range 287–289. The DVA technique must continue as it is attempting to limit motion around 287 and as 289 is further away than 286 it is discarded.

Figure 7:
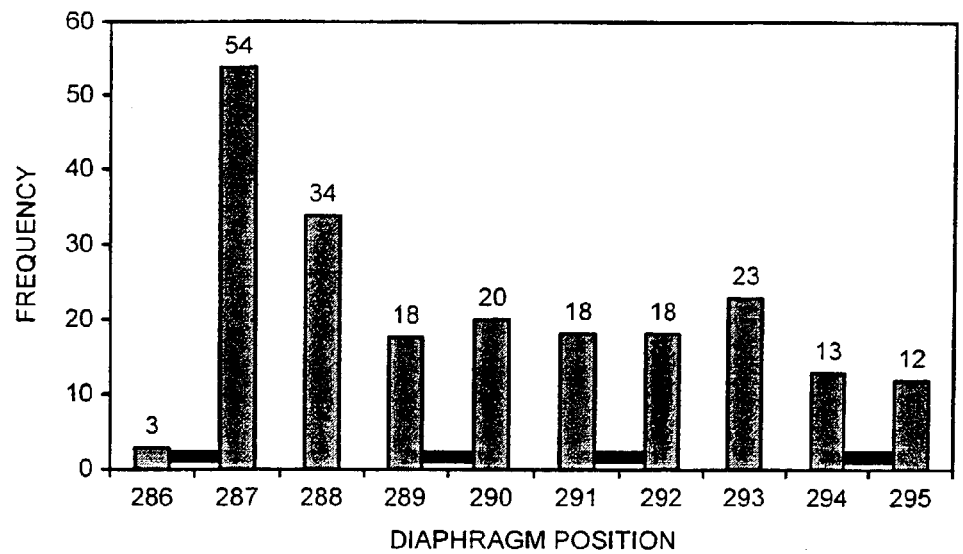

FIG. 7 illustrates how the grouping of diaphragm positions may result in scan inefficiencies. A weighted scheme is used of 2 for the outer bins and 1 for the central bin to produce a 5 mm acceptance window. Positions which have been grouped together are shown linked with a short bar in the graph above. In this example, 128 phase encode lines could be most quickly acquired within the window 287–291. However, as PAWS has grouped together positions 286–287 and 289–290, data acquisition continues until enough lines have been acquired in the window 286–290.

Figure 8:
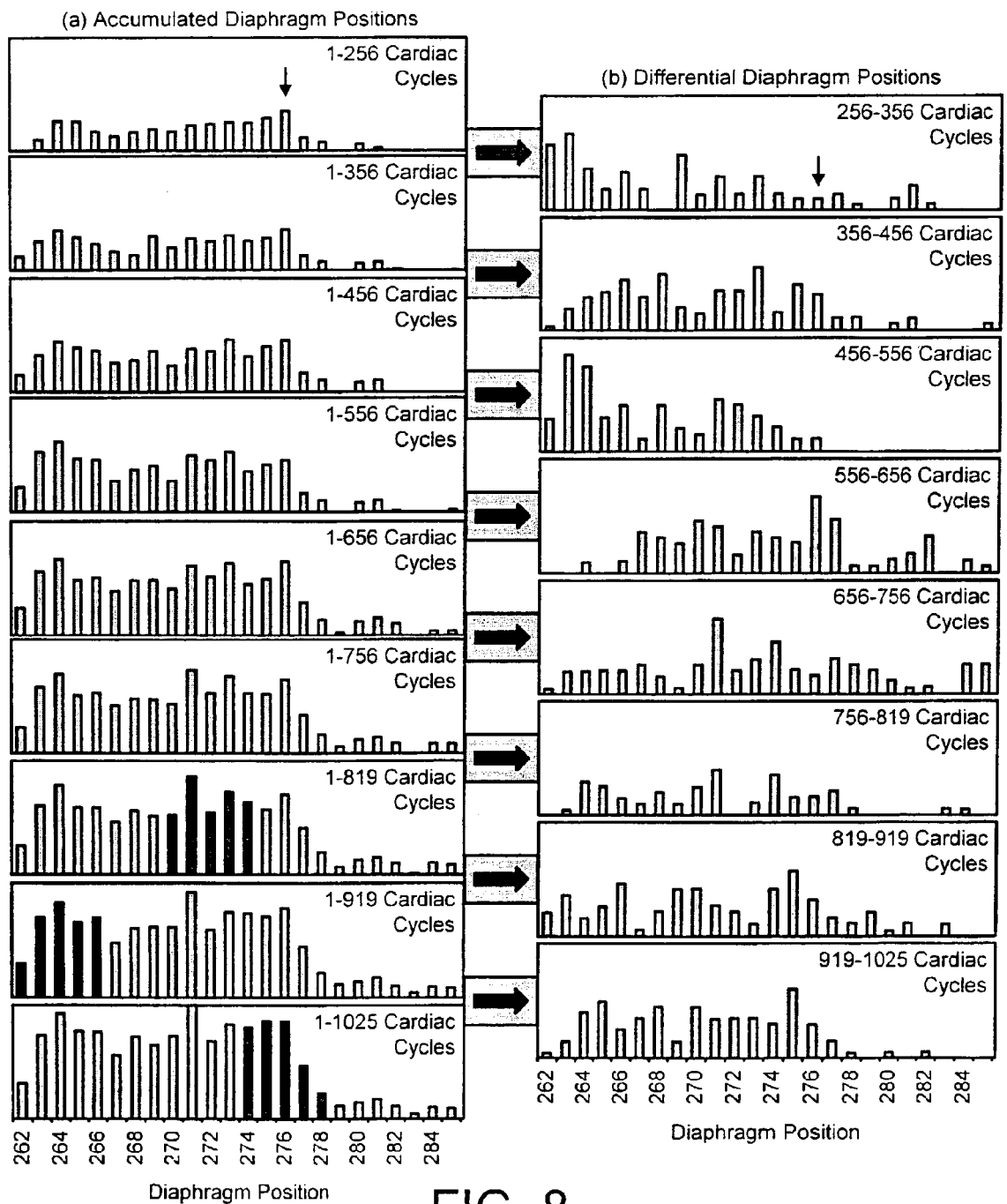

FIG. 8 shows how when the breathing pattern is very variable it is difficult to select an appropriate window. After acquiring 256 views, the DVA method attempts to minimise motion around 276 (a). However, for the next 100 cardiac cycles, the breathing pattern changes so that very few positions are registered around 276 (b). It would not be beneficial to change the acceptance window at this stage as the breathing pattern continues to change over successive periods and again shifts back to a state similar to its original. In this example, the DVA technique requires 1025 cardiac cycles to complete whilst the PAWS technique completes in 819 cardiac cycles. The 'ideal' end-expiration window, which has been retrospectively selected, completes after 919 cardiac cycles.

Figure 9:
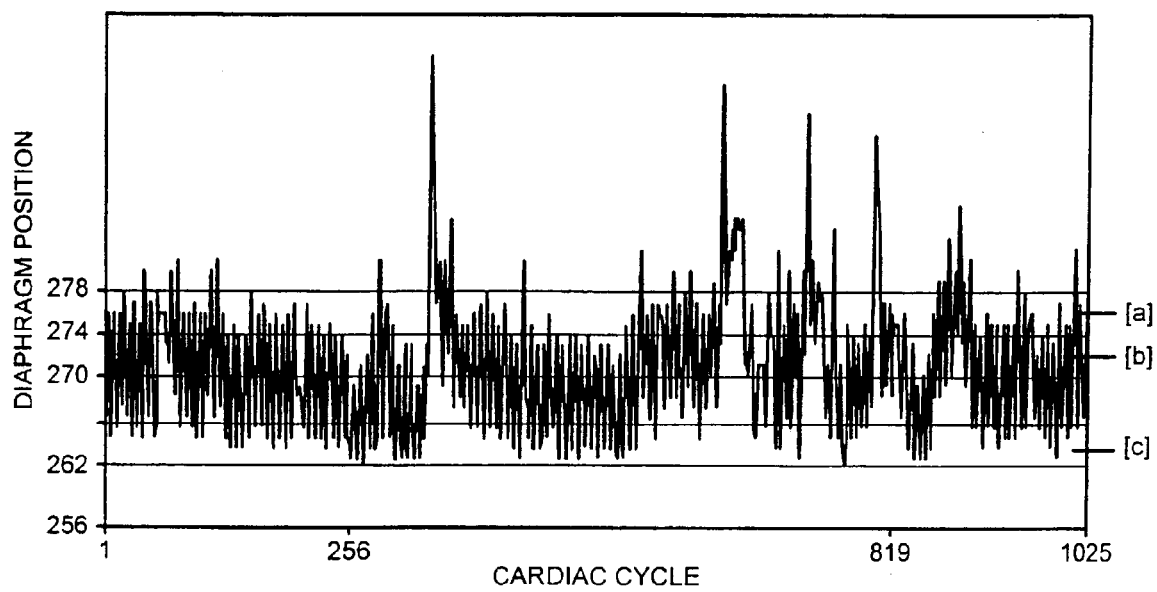

FIG. 9 shows how an extremely variable breathing pattern makes selection of an acceptance window very difficult. The acceptance window selected by the DVA technique [a]and PAWS [b] is highlighted along with a desirable window around end-expiration [c].

Figure 10:
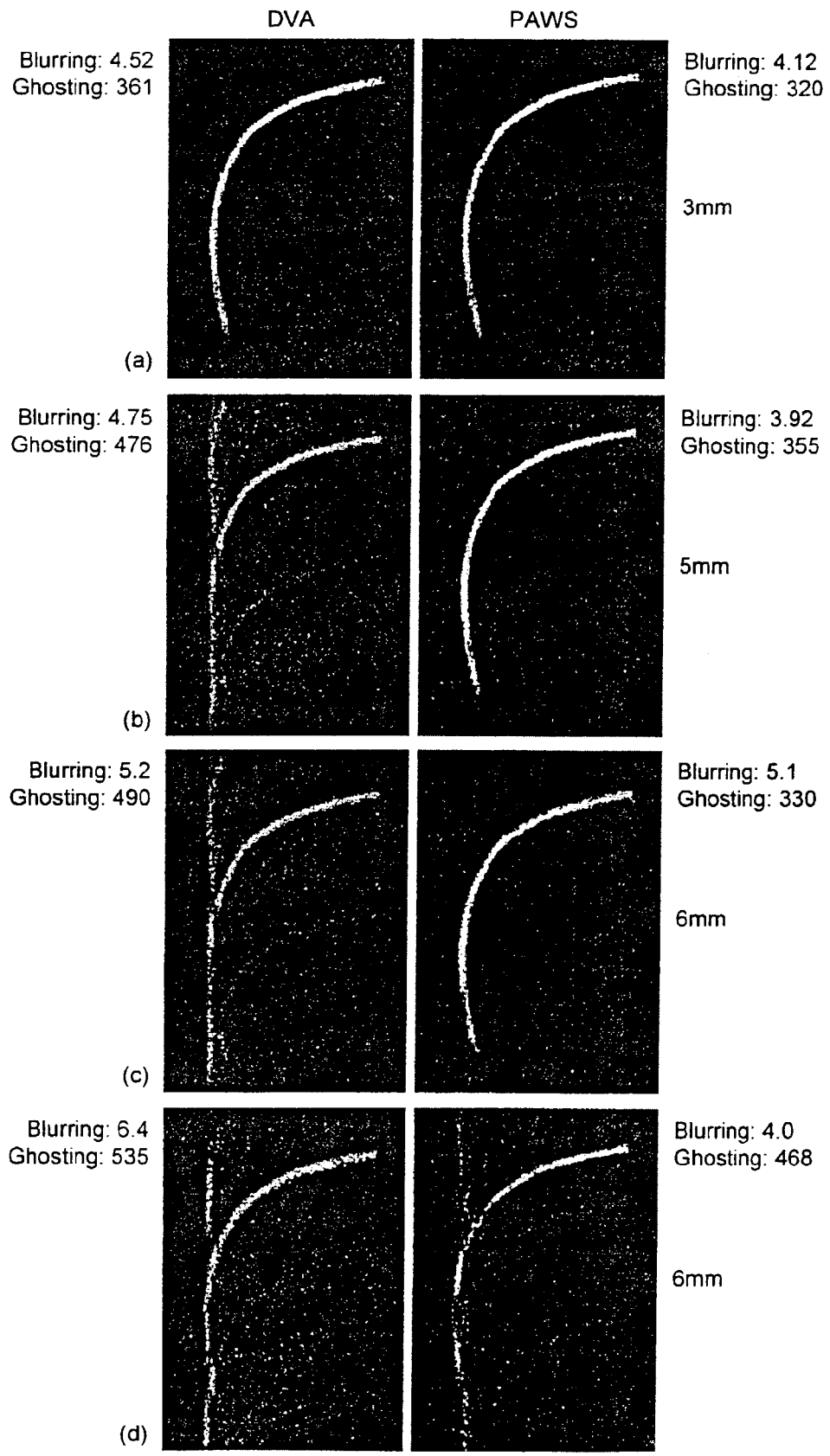

FIG. 10 illustrates the phase ordering, alongside the improved scan efficiency of the PAWS technique, produces better images than the DVA technique in the same scan time. However, as the bin size is increased, particularly in the central region of k-space (c–d), the benefits of using phase ordering are reduced.

Figure 11:
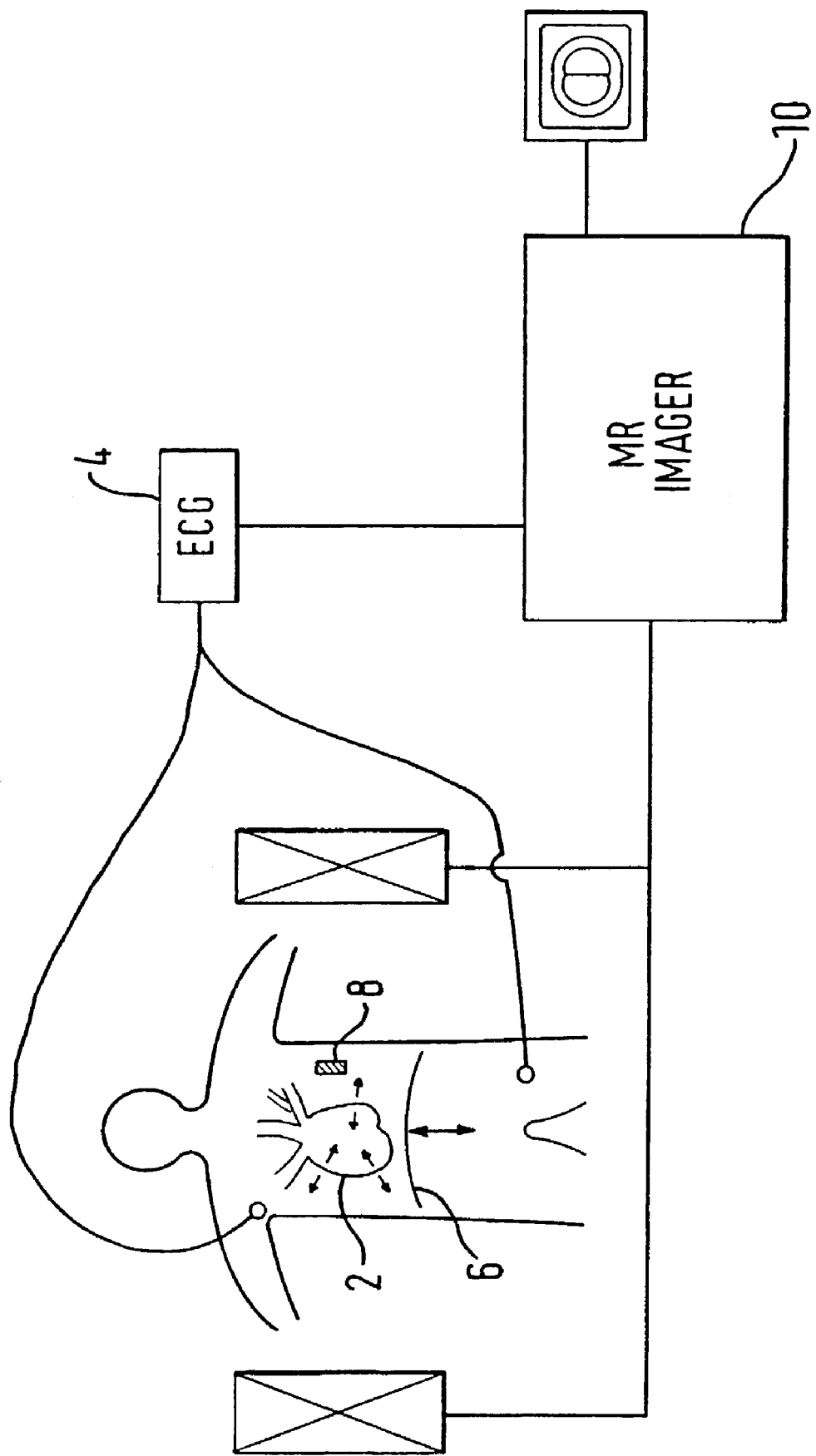

FIG. 11 schematically illustrates a system of magnetic resonance imaging.

Figure 1:
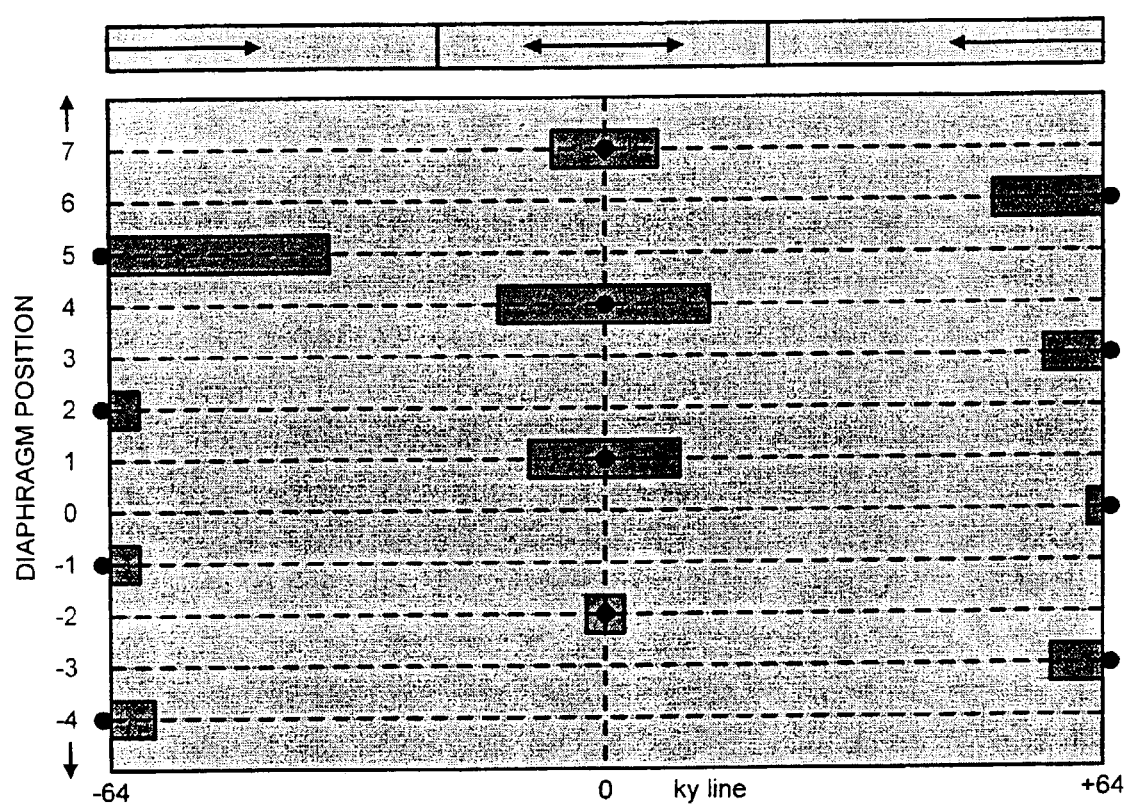
Figure 2:
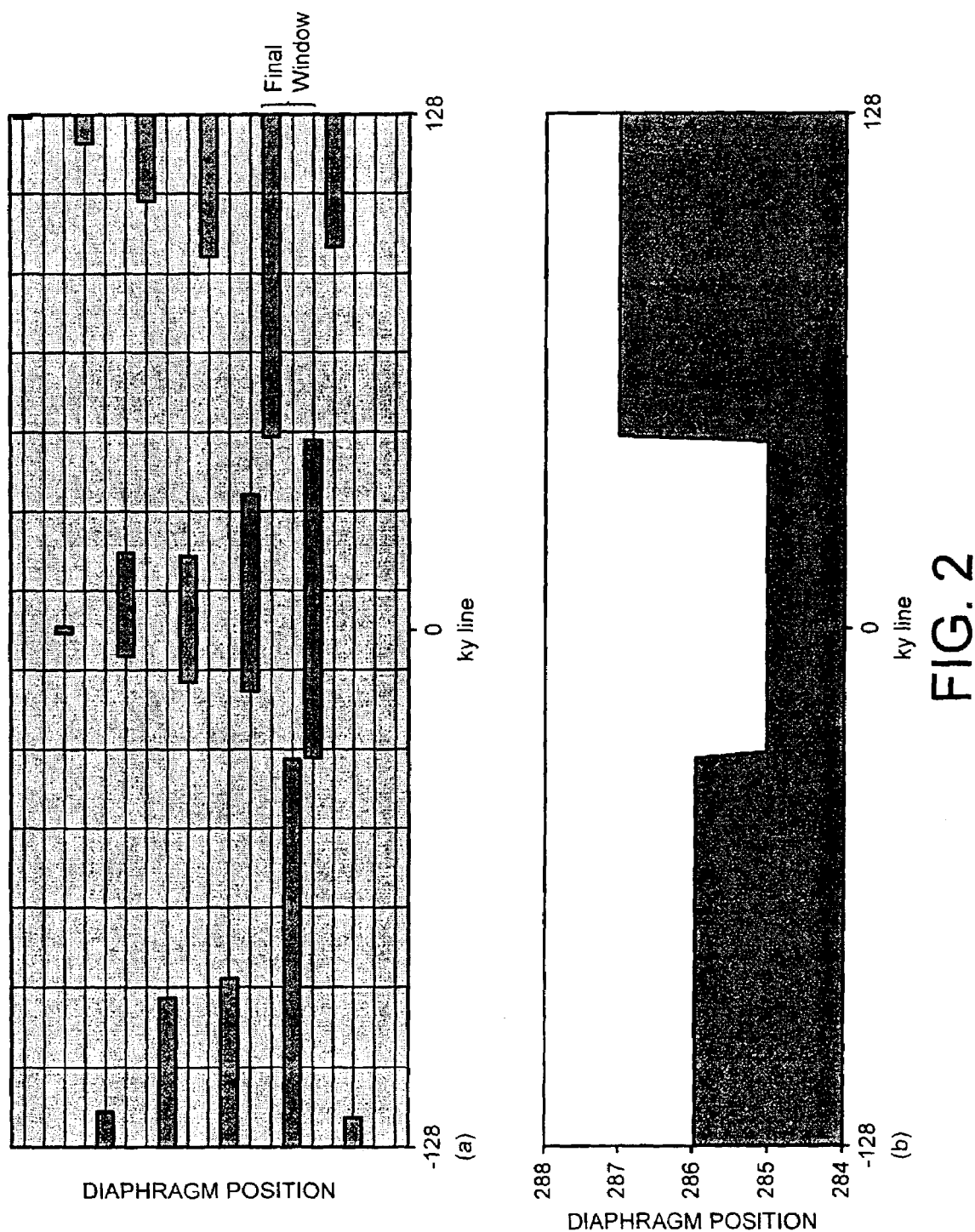
FIG. 2 shows how data acquisition is terminated once the whole of k-space has been acquired by 3 contiguous bins (a). The final displacement through k-space is ordered to reduce respiratory artefacts (b).

The proposed technique, Phase-ordering with Automatic Window Selection (PAWS), uses a multi-level approach where no acceptance window is specified. Instead, the initial position of the diaphragm is taken as the reference and all further diaphragm positions are given an index position which is the displacement from this reference. Each index position is allotted a region of k-space, hereafter called a "bin", as shown in FIG. 1. The k-space region is filled according to the direction of the arrows. Data acquisition for positions on the edges of k-space is straightforward, phase encode lines are acquired sequentially towards the centre of k-space. For positions which start in the centre of k-space, however, the data acquisition scheme is more complicated. Each diaphragm position can be used in one of a combination of 3 separate bins. For example, for index number 4, the three possible combinations of bins which can complete k-space are: 2-3-4, 3-4-5 and 4-5-6. All three combinations are checked to determine which is closest to completion and this information is used to determine whether the right or left side of k-space is acquired. The side which has most unfilled $k_y$ lines remaining is acquired. This is demonstrated in FIG. 1. For the case where the diaphragm is currently at position 4, the window nearest to completion at this moment in time is 4-5-6. As there are more unfilled phase encode lines remaining between 4–6 than 4–5, the phase encode line toward the diaphragm position 6 is acquired. Image acquisition is complete once the whole of k-space has been acquired by 3 contiguous bins. This is demonstrated in FIG. 2. The final image is acquired in the shortest possible time and the phase encode lines have been ordered thus minimising motion artefacts. In this example, the final range of motion is only 3 mm as a bin size of 1 has been used with a navigator resolution of 1 mm.

Figure 3:
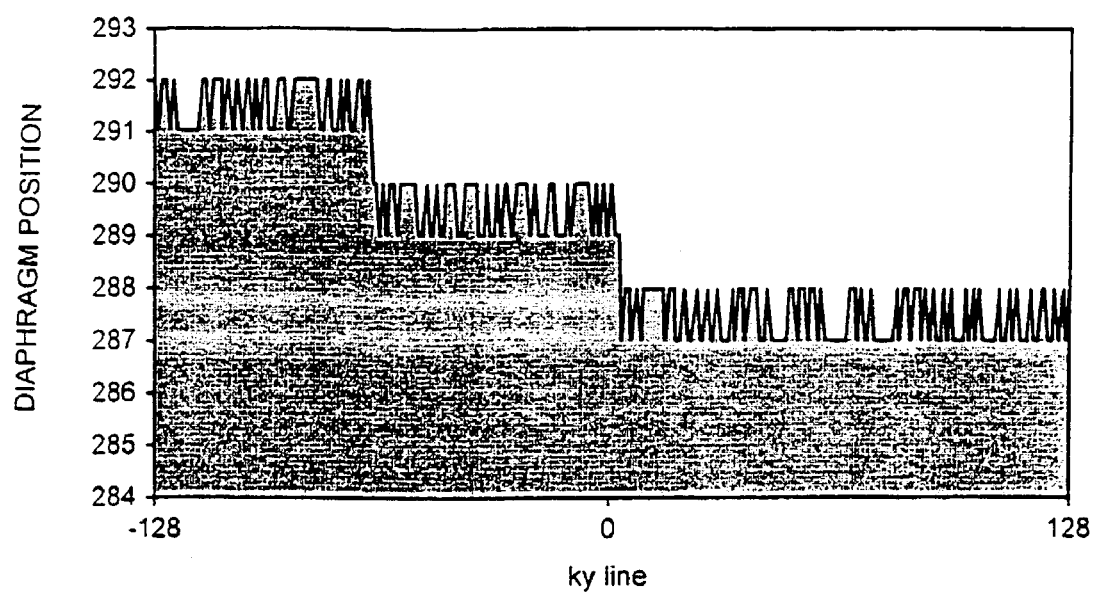
FIG. 3 shows how if the bin size is increased, each individual bin is not ordered which could result in a loss of image quality.

Scan time can further be reduced in two ways: the bin size can be increased, thus allowing more than one index position to map to each individual bin, or the navigator resolution can be decreased so that a wider range of positions map to the same index position. However, image quality may be compromised as the phase ordering within each individual bin is less well defined. FIG. 3 illustrates the final displacement graph for an image acquired with a bin size of 2 and a navigator resolution of 1 mm. Although the benefits of using phase ordering are reduced with an increased bin size or lower navigator resolution, within each individual bin the displacement between any phase encode lines is limited to the bin size. Therefore, although a bin size of 1 and a navigator resolution of 2 mm would produce a displacement graph as shown in FIG. 2b, the range of motion in each bin is similar to that in FIG. 3.

Figure 4:
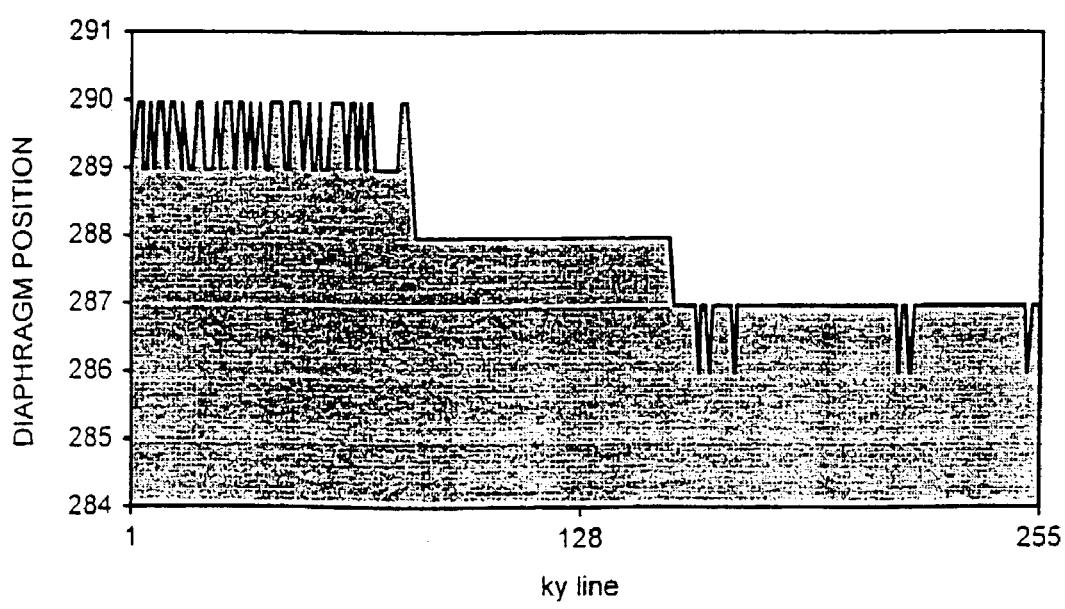
FIG. 4 shows how to limit motion in the centre of k-space, a weighted bins method can be employed. In this example, a bin size or 2 used for the two outer bins whilst the central bin size was one.

To limit motion in the centre of k-space when the bin size is greater than one, a weighted bin scheme can be employed whereby an increased bin size is used for the two outer bins whilst the central bin size remains one. A typical displacement graph is shown in FIG. 4. In this example, a bin size of 2 is used for the outer bins with a navigator resolution of 1 mm for all the bins which gives a window size of 5 mm.

In Vitro Studies

Studies were performed with a whole-body 0.5 T magnet with a reduced diameter (53 cm I.D.) gradient set giving 20 mT/m maximum gradient strength, and a slew rate of 60 mT/m/ms. An MR imaging console (Surrey Medical Imaging Systems) with additional hardware and software was used to generate and drive the gradient and radio-frequency waveforms and to receive and reconstruct the image data. The ordering method was implemented for a fat-suppressed 3D velocity compensated gradient-echo pulse sequence (Te=6 MS). 8 $k_z$ lines were acquired with a TR of 12 ms, resulting in a total acquisition period of 96 ms. Each $K_y$ was acquired after an interval of 800 ms. 256 $K_y$ lines were acquired with a FOV of 300 mm and a slab thickness of 20 mm resulting in a voxel size of 1.2 mm×1.2 mm×2.5 mm.

To compare the effects of the different ordering methods in vitro, complete data sets were acquired of a 4 mm diameter tube. Multiple data sets were acquired with the tube moved by steps of 1 mm between each. The total range of positions was 10 mm. This allowed simulated data sets to be constructed given a series of motion measurements by selecting appropriate ky lines from each data set. The tube was filled with copper sulphate solution (0.5 mM) and curved to represent a coronary artery.

The PAWS technique was compared with the DVA. The DVA method allows a scan to be terminated after a specified time or when the desired range of motion has been achieved. Therefore the methods can be compared to see how long each takes to acquire an image in a specified acceptance window and how effective respiratory artefact reduction is after a defined time.

The techniques were compared with acceptance window sizes of 3 mm (PAWS: bin size=1), 6 mm (PAWS: bin size=2) and 5 mm (PAWS: bin size=2 for outer bins, bin size=1 for central bin). A navigator resolution of 1 mm was used in all cases.

For scan efficiency, respiratory profiles acquired previously from 15 subjects were fed into a simulation program which calculated the scan time and diaphragm displacement graph through k-space for each technique, as well as the shortest scan time possible for each trace with the required acceptance window.

For image quality, the DVA technique was used to construct an image in the same time as that taken by the PAWS technique. The displacement graphs through k-space produced by the simulation program were used to compile motion data sets. Profiles were taken through the images and, for image analysis, measurements were made of the peak signal intensity of the tube, the full width at half maximum (FWHM), the area surrounded by the pixels of the half maximum intensity (area at half maximum [AHM] and the total area (A). FWHM was used to measure blurring and (A-AHM) indicated the level of ghosting in the images.

Table 1 (see later) shows the number of cardiac cycles required to complete a scan for PAWS and the DVA method using the respiratory traces when acquiring an image of 128 PE lines. The shortest scan time possible is also displayed. The average percentage difference from the shortest scan time was only 0.5% (STD=0.7) for the PAWS approach in comparison to 15.5% (STD=26.3) for the DVA approach. The average percentage difference from the shortest scan time using both a weighted bin and a larger bin size are also shown in Table 2. Again, the PAWS approach achieves a shorter scan time with an average percentage difference of 4.6% and 4.7% respectively compared to 13.0% and 16.3% for the DVA approach.

FIG. 5 demonstrates the importance of a navigator window selection and the implications for scan efficiency. A typical respiratory trace with the corresponding 3 mm acceptance window is shown. In this example, the PAWS technique (a) achieves optimal scan efficiency whilst the DVA technique (b) requires 47 extra cardiac cycles, a percentage difference of 18.1% from the optimal scan efficiency, to complete the scan. As explained later, the two methods have opted for slightly different acceptance windows. The DVA method includes the extreme end expiratory position in the acceptance window whilst the PAWS technique discards this position, instead opting to shift the acceptance window by 1 mm to allow optimal scan efficiency. However, just a 1 mm shift has caused a large reduction in scan efficiency.

FIG. 6 demonstrates the processes involved in selecting the final acceptance window. After collecting 128 cardiac cycles of data, the DVA method finds that the most frequency diaphragm position is 287. The DVA technique will therefore attempt to narrow the range of motion around this position. The shortest scan time in this example is 260 cardiac cycles as this is the first point at which 128 diaphragm positions have been recorded within a 3 mm window. As the PAWS technique has acquired everything, it detects that there are 3 contiguous positions which can be used to fill the whole of k-space and therefore terminates, using data in the range 287–289. However, as the DVA technique is attempting to limit motion around the position 287, it is discarding data when the diaphragm is at position 289, even though we know that the scan would finish with a greater scan efficiency if the DVA technique had this position in its acceptance window. The scan must continue therefore, until 128 phase encoding lines have been acquired within the acceptance window 286–288. Although this is a suitable acceptance window, by studying the respiratory trace we can see in retrospect that better decisions could be made.

This example highlights a drawback in the DVA technique. As it attempts to minimise motion around the most frequency position, it is assuming that this position will lie in the centre of the acceptance range. However, if this position is at end expiration, for example, which occurs often, then it is likely that it will occur towards one end of the acceptance window. Therefore, positions further away from end expiration, which should be included, are discarded as they are further from the maximum than other less frequency positions. This is more likely to occur with larger acceptance windows and could be a factor in the reduced efficiency of the DVA technique when the window size is increased.

The PAWS technique is also less efficient as the acceptance window is increased and the principal reason for this lies in the grouping of diaphragm positions when the bin size is greater than one. The initial diaphragm position which is recorded is set to index 0 and each successive diaphragm position is given an index relative to this. In cases where the bin size is greater than one, diaphragm positions are grouped together in what may eventually not be the most optimal way. This is demonstrated in FIG. 7. For a 5 mm window, the mot efficient scan time for the acquisition of 128 phase encode lines would have occurred after 190 cardiac cycles in the window 287–291. However, because of the way PAWS has grouped the diaphragm positions, 286 and 287 are paired together and the window 287–291 is not possible. The acquisition must therefore continue and completes after 217 cardiac cycles.

If a window combination is therefore unavailable to PAWS, there is potential for loss of scan efficiency given the scan parameters. However, as we mentioned earlier, there are two possible ways of achieving the same window sizes: by altering the bin size and by altering the navigator resolution. Therefore, if we are using a bin size of 2 and a navigator resolution of 1 mm, PAWS may not perform in the shortest time possible as the most efficient window is not available. If these parameters are changed however, and a bin size of 1 is used with a lower navigator resolution of 2 mm, the window size remains the same but PAWS can now complete in the shortest time possible for the scan given the parameters. The use of a reduced navigator resolution for the 6 mm window reduced the average difference from the shortest scan time from 4.7% to 2.6%. It is important to note however that although an improvement was found by using the reduced navigator resolution as opposed to a larger bin size, this method is also grouping diaphragm positions, the difference being that the PAWS algorithm can now complete with the same window as that chosen by the simulation program when calculating the shortest scan time possible. Depending on the grouping, the shortest scan time possible may change from one set of parameters to the next. However, given the infinite variations of possible parameters, as the PAWS technique is more efficient given a single bin size, we feel that the lowest navigator resolution possible should be used. This technique also aided the DVA approach. In one particular case (subject 1) the DVA method selected a window around inspiration as the most frequency position occurred here. However, grouping navigator positions by way of reducing the resolution of the navigator allowed DVA to focus on a larger more frequent region and allowed the scan to terminate in a much shorter scan time with a saving of 203 cardiac cycles.

FIG. 8 demonstrates the problems encountered when attempting to acquire data in a situation where the breathing pattern is extremely variable. The accumulated diaphragm position histograms (a) are shown alongside the differential histograms (b) and the corresponding breathing pattern is shown in FIG. 9. This is an actual breathing pattern and demonstrates the inconsistent nature of breathing often observed during an acquisition. In this example, 256 views are acquired to demonstrate the changes in breathing and implications for scan efficiency and image quality during a long acquisition. As we can see, after 256 cardiac cycles, diaphragm position 276 is the most frequent and, therefore, the DVA technique attempts to minimise motion around this position. However, during the next 100 cardiac cycles, this position only occurs twice as the breathing pattern has changed significantly. If we continue to monitor the differential histogram we see that the breathing pattern differs greatly from one period of 100 cardiac cycles to the next and eventually reverts back to a pattern more similar to the original. Therefore, there would be little advantage in altering the acceptance window for the DVA technique as we would simply encounter the problem of a change in the breathing during each successive period. With such a varying breathing pattern, a technique which bases its decisions on the breathing pattern so far to predict what will happen next is unlikely to be particularly successful and it is in such cases that the PAWS technique is most useful. As PAWS is ordering and accepting all the data, it simply completes once the appropriate number of phase encoding lines have been acquired within the contiguous bins. Therefore, regardless of the breathing pattern, the PAWS algorithm will complete in, or close to the shortest possible time. In this example, PAWS completes in 819 cardiac cycles whilst DVA requires 1025 cardiac cycles to complete.

FIG. 9 also illustrates a problem of all techniques which use the frequency information to select the most suitable window. Both DVA and PAWS select a window which is towards inspiration (DVA: 274–278; PAWS: 270–274). However, acquisitions made when the diaphragm is towards inspiration are more likely to suffer motion artefact as the diaphragm is moving with a greater velocity (12). Therefore, it is not only important to place the acceptance window around a frequency occurring diaphragm position, but this position should also preferably be around end-expiration. Again, the PAWS technique is ideally suited to this requirement as data from all respiratory positions has been acquired. Therefore, even when all phase encode lines have been completed in 3 contiguous bins, data acquisition can continue with the aim of completing all the phase encoding lines in an end-expiration window. As we will know how close to completion each window is, we can judge how long the additional scanning is likely to require and if data acquisition takes too long, then the images from the original window can be accepted by the user. In the example in FIGS. 8–9, a 5 mm window could have been completed by PAWS around end-expiration after 919 cycles, more than 100 cardiac cycles before the DVA technique completed.

It is also important to note that the window, [c], which has been chosen to be the most desirable in terms of image quality in FIG. 9 is unlikely to have been selected were a decision to be formed after either an initial period of monitoring the diaphragm position or after analysis of scan efficiency as many of the positions occur much later in the scan and many do not occur even in the initial 256 cardiac cycles. Instead, it is only in retrospect, having weighed up both scan efficiency and image quality costs, that this window is selected. This is the principal benefit of the PAWS technique. It is possible during data acquisition to analyse the subject's breathing pattern and the progress of acquisition for any window. As the order of data acquisition is the same, regardless of the final window we may choose, it is possible to make an infinite number of alterations to the final window with no loss in scan efficiency. This is extremely useful in situations where a window placed around end-expiration is now acquiring data in inspiration.

As well as the desire to acquire images from around end-expiration, there is also a preference as to the final ordering of the phase encoding lines. In our previous studies into the effects of different ordering patterns on coronary artery imaging, we found that the use of an asymmetric ordering pattern produced considerably better images than the use of a symmetric ordering pattern (13). Therefore, if the initial data set which completes produces a symmetric ordering pattern, we could balance up the expected gains in image quality and the extra time required to complete a more suitable window resulting in an asymmetric pattern. It is important to note, however, that both ordering patterns produced better images than those acquired without the use of ordering.

FIG. 10 demonstrates the advantages of using phase ordering with the PAWS technique. In each case the phase ordered images have reduced ghosting and blurring. However, as we would expect, as the window size is increased the artefacts increase for both methods (FIG. 10b–d). The mean and standard deviation for ghosting and blurring measurements for each method are shown in Table 3 for all 15 subjects. The PAWS method was more effective at reducing both blurring and ghosting artefacts if the motion in the centre of k-space was limited (FIG. 10a–b). As we increase the bin size, the advantages of using ordering are diminished (FIG. 10c–d). However, the use of a weighted technique, whereby the motion in the centre of k-space is restricted whilst the outer regions are acquired within larger acceptance ranges, allows an effective compromise between image quality and scan efficiency (FIG. 10b).

As the PAWS and DVA techniques select a window primarily on the basis of scan efficiency, it is possible that over successive acquisitions the position of the window could change. This could lead to misregistration problems between images. However, it could be possible to combine the techniques with slab following to ensure a more consistent window for all images. Therefore, after the initial acquisition, the centre of the window is used as a reference position. We could use slab following to ensure that all further acquisitions occur at the same point. The use of phase ordering could also help overcome the small phase errors and pseudo-motion ghosting from stationary tissues which result from the use of slab following by ensuring that the relative errors between successive phase encode lines is minimal.

Once the appropriate window has been selected from the multiple windows which have been acquired, several partially complete data sets remain. It may therefore be possible to use a combination of data averaging and post-processing to utilise more of the data to further improve image quality. Also, more than one data set could be acquired in a single acquisition.

A method is introduced which is resistant to changes in breathing and allows images to be acquired in the shortest possible scan time with no requirement for operator interaction. The ability to integrate the use of phase ordering with a flexible window selection strategy further allows improvements in image quality. This method has proved to be effective both in improving scan efficiency and reducing respiratory motion artefacts in our in vitro studies. We believe this technique will aid in overcoming many of the current problems faced with navigator acceptance techniques, providing an ordering technique robust against changes in breathing which has previously not be possible.

FIG. 11 schematically illustrates a magnetic resonance imaging system for use in imaging a heart 2. The heart 2 is subject to periodic motion due to its beating. An ECG sensor detects when the heart 2 is at a predetermined point within its beat. The heart 2 is also subject to a period motion due to the patient breathing and motion of their diaphragm 6. A magnetic resonance target 8 may be used by the MR imager 10 to track this motion. In this way, MR data may be recovered at a fixed point in the beat of the heart 2 at different points within the respiratory cycle and the sensed position of the target 8 used to direct the sampled data into an appropriate sample bin as discussed above.

It will be appreciated that the technique of the present invention may be conveniently embodied as part of software running on a general purpose computer for analysing the data signals recovered from the MR imaging.

REFERENCES

1. Y. L. Liu, S. J. Riederer, P. J. Rossman, R. C. Grimm, J. P. Debbins, R. L. Ehman, A monitoring, feedback, and triggering system for reproducible breath-hold MR imaging. *Magn. Reson. Med.* 30, 507–511 (1993).
2. T. S. Sachs, C. H. Meyer, B. S. Hu, J. Kohli, D. G. Nishimura, A. Macovski, Real-time motion detection in spiral MRI using navigators. *Magn. Reson. Med.* 32, 639–645 (1994).
3. Y. Wang, P. J. Rossman, R. C. Grimm, S. J. Riederer, R. L. Ehman, Navigator-echo based real-time respiratory gating and triggering for reduction of respiration effects in three-dimensional coronary MR angiography. *Radiology* 198, 55–60 (1996).
4. T. S. Sachs, C. H. Meyer, P. Irarrazabal, B. S. Hu, D. G. Nishimura, A. Macovski, The diminishing variance algorithm for real-time reduction of motion artifacts in MRI. *Magn. Reson. Med.* 34, 412–429 (1995).
5. D. Li, C. B. Paschal, E. M. Haacke, L. P. Adler, Coronary arteries: three-dimensional MR imaging with fat saturation and magnetization transfer contrast. *Radiology* 187, 401406 (1993).
6. M. B. M. Hofman, C. B. Paschal, D. Li, E. M. Haacke, A. C. van Rossum, M. Sprenger, MRI of coronary arteries: 2D breath-hold vs 3D respiratory-gated acquisition. *J. Comput. Assist. Tomogr.* 19, 56–62 (1995).
7. D. Li. S. Kaushikklar, E. M. Haacke, P. K. Woodard, P. J. Dhawale, R. M. Kroeker, G. Laub, Y. Kuginuki, F. R. Gutierrez, Coronary arteries: three dimensional MR imaging with retrospective respiratory gating. *Radiology* 201. 857–363 (1996).
8. P. Jhooti, F. Wiesmann, A. M. Taylor, P. D. Gatehouse, G. Z. Yang, J. Keegan, D. Pennell, D. N. Firmin, Hybrid ordered phase encoding: an improved approach for respiratory artefact reduction, *J. Magn. Reson. Imaging* 8, 968–980 (1998).
9. P. Jhooti, J. Keegan, P. D. Gatehouse, S. Collins, A. Rowe, A. M. Taylor, D. N. Firmin; 3D Coronary Artery Imaging with Phase Reordering for Improved Scan Efficiency. *Magn. Reson. Med.* 41, 555–562 (1999).
10. R. Sinkus, P. Börnert, Real-time reduction of motion artefacts using k-space weighting, in "Proc., ISMRM, 5$^{th}$ Annual Meeting, Vancouver, 1997," p. 1894.
11. M. Weiger, P. Börnert, R. Proksa, T. Schäffter, A. Haase, Motion-Adapted Gating Based on k-Space Weighting for Reduction of Respiratory Motion Artifacts, *Magn. Resn. Med.* 38, 322–333 (1997).
12. A. M. Taylor, P. Jhooti, F. Wiesmann, J. Keegan, D. N. Firmin, D. J. Pennell, MR navigator-echo monitoring of temporal changes in diaphragm position: implications for MR coronary angiography. *J. Magn. Reson. Imaging* 7, 629–636 (1997).
13. P. Jhooti, P. D. Gatehouse, J. Keegan, D. N. Firmin, Phase ordering techniques: implications for coronary artery imaging. Submitted for publication 1999

Tables

TABLE 1

Number of cardiac cycles required to acquire 128 phase encode lines within a 3 mm acceptance window.

| | Least Cardiac Cycles Required | DVA Cardiac Cycles | PAWS Cardiac Cycles |
|---|---|---|---|
| 1 | 559 | 1103 | 565 |
| 2 | 507 | 671 | 507 |
| 3 | 765 | 765 | 765 |
| 4 | 260 | 307 | 260 |
| 5 | 300 | 300 | 300 |
| 6 | 238 | 268 | 239 |
| 7 | 290 | 290 | 291 |
| 8 | 273 | 273 | 273 |
| 9 | 227 | 227 | 230 |
| 10 | 515 | 520 | 515 |
| 11 | 467 | 467 | 467 |
| 12 | 451 | 497 | 453 |
| 13 | 358 | 420 | 366 |
| 14 | 541 | 774 | 547 |
| 15 | 364 | 364 | 364 |

TABLE 2

Percentage difference between cardiac cycles required to acquire 128 phase encode lines using the DVA and PAWS technique compared to the optimum scan time.

| Acceptance Window | DVA | PAWS |
|---|---|---|
| 3 (Bin 1-1-1) | 15.5% (STD 26.3) | 0.5% (STD 0.7) |
| 5 (Bin 2-1-2) | 13.0% (STD 17.9) | 4.6% (STD 4.8) |
| 6 (Bin 2-2-2) | 16.3% (STD 19.1) | 4.7% (STD 4.6) |

TABLE 3a

Mean blurring measurements for tube using traces acquired from 15 subjects using PAWS and DVA.

| Acceptance Window | DVA | PAWS |
|---|---|---|
| 3 (Bin 1-1-1) | 4.4% (STD 0.4) | 4.2% (STD 0.5) |
| 5 (Bin 2-1-2) | 4.7% (STD 0.5) | 5.3% (STD 1.2) |
| 6 (Bin 2-2-2) | 5.1% (STD 0.7) | 5.0% (STD 0.8) |

TABLE 3b

Mean Ghosting measurements for tube using traces acquired from 15 subjects using PAWS and DVA.

| Acceptance Window | DVA | PAWS |
|---|---|---|
| 3 (Bin 1-1-1) | 434.7% (STD 44.8) | 330.9% (STD 12.8) |
| 5 (Bin 2-1-2) | 423.3% (STD 61.5) | 371.6% (STD 28.8) |
| 6 (Bin 2-2-2) | 458.6% (STD 67.2) | 438.9% (STD 65.8) |

What is claimed is:

1. Apparatus for magnetic resonance imaging a target object, said apparatus comprising:
   a magnetic resonance imaging scanner for exciting said target object and recovering at least one line of imaging data in k-space;
   a first sensor for detecting a signal indicative of a position of said target object relative to said magnetic resonance imaging scanner;
   classifying logic for classifying said at least one line of imaging data into one of a plurality of groups of lines of imaging data in dependence upon said position detected by said first sensor as said target object was excited, each group of lines corresponding to one of a plurality of contiguous ranges of position relative to said magnetic resonance imaging scanner; and scan terminating logic for detecting when two or more groups of lines corresponding to contiguous ranges of position together contain a set of lines of imaging data spanning k-space from which an image can be derived and terminating data acquisition.

2. Apparatus as claimed in claim 1, wherein said target object is subject to periodic motion, further comprising a second sensor for detecting when said target object is at a predetermined state within said periodic motion, and wherein said magnetic resonance imaging scanner is responsive to said second sensor detecting said target object is at said predetermined state to trigger said excitation.

3. Apparatus as claimed in claim 1, wherein said target object is an in vivo organ.

4. Apparatus as claimed in claim 3, wherein said target object is a heart.

5. Apparatus as claimed in claim 4, wherein said second sensor is an ECG sensor.

6. Apparatus as claimed in claim 1, wherein said first sensor detects changes in position of said target object due to respiration.

7. Apparatus as claimed in claim 6, wherein said first sensor is a magnetic resonance sensor for sensing diaphragm position.

8. Apparatus as claimed in claim 1, wherein when a line of imaging data can be selected to be acquired on either side of k-space corresponding to two different groups of lines, said line is acquired in that group closest to forming one of two or more groups of lines corresponding to contiguous ranges of position together containing a set of lines of imaging data spanning k-space from which an image can be derived.

9. Apparatus as claimed in claim 1, wherein at least one group of lines close to a central position detected by said first sensor corresponds to a smaller range of positions than a group of lines further from said central position.

10. A method of magnetic resonance imaging a target object, said method comprising the steps of:

exciting said target object and recovering at least one line of imaging data in k-space using a magnetic resonance imaging scanner;

detecting a signal indicative of a position of said target object relative to said magnetic resonance imaging scanner;

classifying said at least one line of imaging data into one of a plurality of groups of lines of imaging data in dependence upon said position detected as said target object was excited, each group of lines corresponding to one of a plurality of contiguous ranges of position relative to said magnetic resonance imaging scanner; and detecting when two or more groups of lines corresponding to contiguous ranges of position together containing a set of lines of imaging data spanning k-space from which an image can be derived and terminating data acquisition.

11. A computer program medium storing a computer program for controlling a computer coupled apparatus for magnetic resonance imaging a target object, said apparatus comprising:

a magnetic resonance imaging scanner for exciting said target object and recovering at least one line of imaging data in k-space;

a first sensor for detecting a signal indicative of a position of said target object relative to said magnetic resonance imaging scanner; said computer program serving to control said computer to perform the steps of:

classifying said at least one line of imaging data into one of a plurality of groups of lines of imaging data in dependence upon said position detected as said target object was excited, each group of lines corresponding to one of a plurality of contiguous ranges of position relative to said magnetic resonance imaging scanner; and detecting when two or more groups of lines corresponding to contiguous ranges of position together containing a set of lines of imaging data spanning k-space from which an image can be derived and terminating data acquisition.

* * * * *